United States Patent
Lan et al.

(10) Patent No.: US 9,112,042 B2
(45) Date of Patent: Aug. 18, 2015

(54) THIN FILM TRANSISTOR

(75) Inventors: Wei-Chou Lan, Hsinchu (TW); Ted-Hong Shinn, Hsinchu (TW); Henry Wang, Hsinchu (TW); Chia-Chun Yeh, Hsinchu (TW)

(73) Assignee: E INK HOLDINGS INC., Hsinchu (TW)

( * ) Notice: Subject to any disclaimer, the term of this patent is extended or adjusted under 35 U.S.C. 154(b) by 0 days.

(21) Appl. No.: 13/611,279

(22) Filed: Sep. 12, 2012

(65) Prior Publication Data
US 2013/0175520 A1 Jul. 11, 2013

(30) Foreign Application Priority Data
Jan. 11, 2012 (TW) .............................. 101101061 A

(51) Int. Cl.
*H01L 29/786* (2006.01)
*H01L 29/49* (2006.01)

(52) U.S. Cl.
CPC ...... *H01L 29/78696* (2013.01); *H01L 29/4908* (2013.01)

(58) Field of Classification Search
CPC .............. H01L 29/786; H01L 29/4908; H01L 29/78696; H01L 51/0545; H01L 29/7869
USPC .................................................... 257/43, 40
See application file for complete search history.

(56) References Cited

U.S. PATENT DOCUMENTS

| 7,851,788 | B2 * | 12/2010 | Ohta ................................. 257/40 |
| 2007/0145354 | A1 * | 6/2007 | Birau et al. ....................... 257/40 |
| 2010/0244029 | A1 | 9/2010 | Yamazaki et al. |
| 2012/0012835 | A1 * | 1/2012 | Herman et al. .................. 257/43 |
| 2012/0146002 | A1 * | 6/2012 | Stecker et al. ................... 257/40 |

FOREIGN PATENT DOCUMENTS

| CN | 101669225 | 3/2010 |
| TW | 201035132 | 10/2010 |
| TW | 201108416 | 3/2011 |

OTHER PUBLICATIONS

China Patent Office, "Office Action", Mar. 17, 2015.
Taiwan Patent Office, "Office Action", Mar. 19, 2014.

* cited by examiner

*Primary Examiner* — Evan Pert
(74) *Attorney, Agent, or Firm* — WPAT, PC; Justin King

(57) ABSTRACT

A thin film transistor suitable for being disposed on a substrate is provided. The thin film transistor includes a gate electrode, an organic gate dielectric layer, a metal oxide semiconductor layer, a source electrode and a drain electrode. The gate electrode is disposed on the substrate. The organic gate dielectric layer is disposed on the substrate to cover the gate electrode. The source electrode, the drain electrode and the metal oxide semiconductor layer are disposed above the organic gate dielectric layer, and the metal oxide semiconductor layer contacts with the source electrode and the drain electrode. Because the channel layer of the thin film transistor is a layer of metal oxide semiconductor formed at a lower temperature, thus the thin film transistor can be widely applied into various display applications such as flexible display devices.

10 Claims, 2 Drawing Sheets

THIN FILM TRANSISTOR

TECHNICAL FIELD

The present invention relates generally to a semiconductor structure, and more particularly to a thin film transistor.

BACKGROUND

With the progress of fabricating technique, various display applications are developed out. To meet the requirements of lighter, thinner, shorter, smaller, and more portable, the development of display applications of the next generation is focused on the flexibility and portability. Currently, flexible displays and electronic paper displays attract considerable attention and are also well researched and developed.

Nowadays, thin film transistors are widely used in various display devices. Thus, the structure design and the materials of thin film transistors significantly affect the performance of display devices.

Generally, a thin film transistor at least includes a gate electrode, a source electrode, a drain electrode and a channel layer. The conductivity of the channel layer can be controlled by adjusting the potential of the gate electrode such that the source electrode and the drain electrode are electrically conducted (on-state) or isolated (off-state). In known thin film transistors, channel layer usually includes amorphous silicon (a-Si) or poly-silicon (p-Si).

However, a high process temperature is required for thin film transistors having channel layer of either a-Si or p-Si. Furthermore, flexible display devices usually include a flexible substrate such as a plastic substrate. As commonly known, plastic substrate has a low softening temperature. Thus, when thin film transistors with channel layer of either a-Si or p-Si are applied into flexible display devices, the flexible substrate transforms or deteriorates in the fabricating process of thin film transistors. Therefore, the known thin film transistors are not suitable for being applied into flexible display devices.

SUMMARY

The present invention provides a thin film transistor that can be manufactured without high temperature process and thus can be widely applied into various display applications.

In one embodiment, a thin film transistor suitable for being disposed on a substrate is provided. The thin film transistor includes a gate electrode, an organic gate dielectric layer, a metal oxide semiconductor layer, a source electrode and a drain electrode. The gate electrode is disposed on the substrate. The organic gate dielectric layer is disposed on the substrate to cover the gate electrode. The source electrode, the drain electrode and the metal oxide semiconductor layer are disposed above the organic gate dielectric layer, and the metal oxide semiconductor layer contacts with the source electrode and the drain electrode.

In another embodiment, a thin film transistor suitable for being disposed on a substrate is provided. The thin film transistor includes a gate electrode, an organic gate dielectric layer, a metal oxide semiconductor layer, a source electrode and a drain electrode. The source electrode, the drain electrode and the metal oxide semiconductor layer are disposed on the substrate, and the metal oxide semiconductor layer covers the source electrode and the drain electrode. The gate electrode is disposed on the metal oxide semiconductor layer to cover the source electrode and the drain electrode. The gate electrode is disposed on the organic gate dielectric layer.

Because the channel layer of the thin film transistor is metal oxide semiconductor that can be formed without high temperature processes, thus the thin film transistor can be widely applied into various display applications such as flexible display devices.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
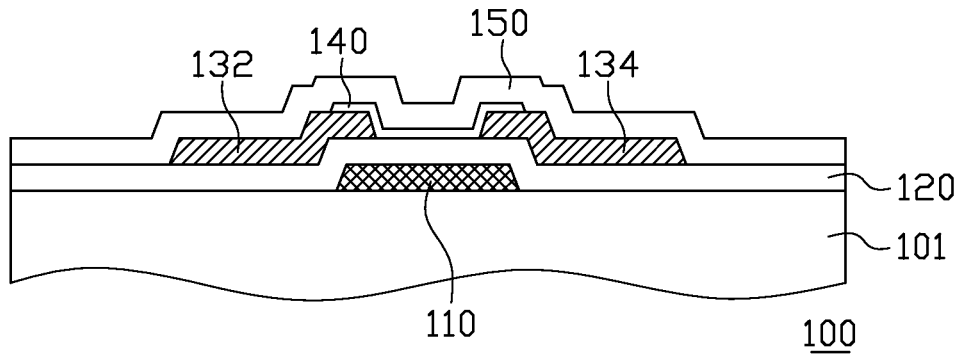
FIG. 1 is a schematic view of a thin film transistor in accordance with a first embodiment.

FIG. 1 is a schematic view of a thin film transistor (TFT) 100 in accordance with a first embodiment. Referring to FIG. 1, the TFT 100 is disposed on a substrate 101, and includes a gate electrode 110, an organic gate dielectric layer 120, a metal oxide semiconductor (MOS) layer 140, a source electrode 132, and a drain electrode 134. The substrate 101, for example, is a rigid substrate such as a glass substrate 101, or a flexible substrate such as a plastic substrate.

It should be noted that if the substrate 101 is a flexible substrate, the substrate 101 can be disposed onto a rigid carrier plate (not shown) at first. After the TFT 100 is finished, the rigid carrier plate can be separated from the substrate 101.

Referring again to FIG. 1, the gate electrode 110 is disposed on the substrate 101, and the organic gate dielectric layer 120 is disposed on the substrate 101 to cover the gate electrode 110. The source electrode 132, the drain electrode 134, and the MOS layer 140 are disposed above the organic gate dielectric layer 120, and the MOS layer 140 contacts with the source electrode 132 and the drain electrode 134. The MOS layer 140 includes indium gallium zinc oxide (IGZO), indium zinc oxide (IZO) or a combination thereof. In the present embodiment, the source electrode 132 and the drain electrode 134 are individually dispose on the organic gate dielectric layer 120. Then, the MOS layer 140 is disposed on the organic gate dielectric layer 120 to cover the source electrode 132 and the drain electrode 134 (as shown in FIG. 1). In another embodiment, the MOS layer 140 can also be disposed on the organic gate dielectric layer 120 at first, and then the source electrode 132 and the drain electrode 134 are disposed on the organic gate dielectric layer 120 to cover a portion of the MOS layer 140 (not shown). However, the configuration of the MOS layer 140, the source electrode 132, and the drain electrode 134 are not limited to the above examples. Additionally, in the present embodiment, the TFT 100 further includes a protective layer 150 disposed on the substrate 101 and covering the MOS layer 140, the source electrode 132 and the drain electrode 134.

The gate electrode 110, for example, includes molybdenum. The organic gate dielectric layer 120 and the protective layer 140, for example, include flexible organic materials such as organic polymers (i.e., resin or other polymers). The source electrode 132, and the drain electrode 134, for example, is a composite layer of titanium/aluminum/titanium.

Figure 2:
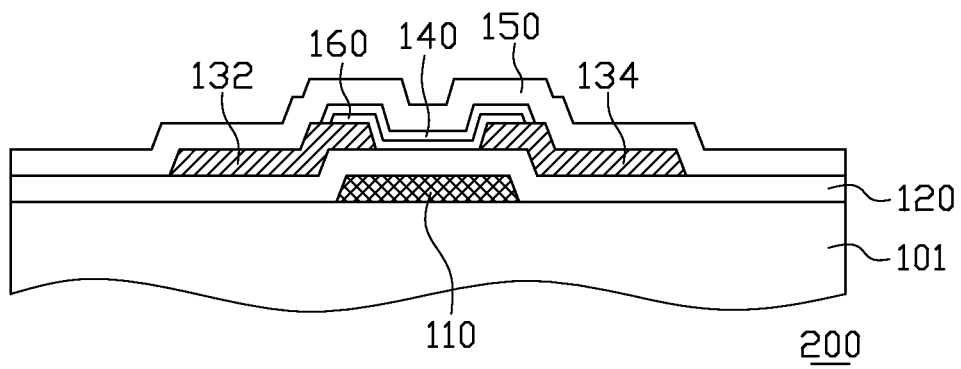
FIG. 2 is a schematic view of a thin film transistor in accordance with a second embodiment.

In another embodiment, as shown in FIG. 2, a TFT 200 may further include a barrier layer 160 interposed between the organic gate dielectric layer 120 and the MOS layer 140. The barrier layer 160, for example, includes silicon oxide, and the barrier layer 160 is configured for isolating the organic gate dielectric layer 120 from the MOS layer 140 such as to avoid the organic gate dielectric layer 120 changing the performance of conductivity of the MOS layer 140.

Figure 3:
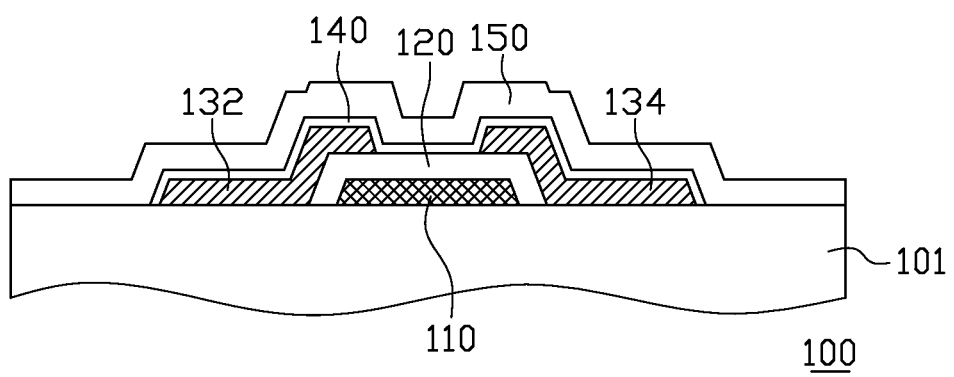
FIG. 3 is a schematic view of a thin film transistor in accordance with a third embodiment.

In addition, the source electrode 132 and the drain electrode 134 in FIG. 1 are disposed on a portion of the organic gate dielectric layer 120, and the MOS layer 140 is disposed on the source electrode 132, the drain electrode 134 and a portion of the organic gate dielectric layer 120 that is not covered by the source electrode 132 and the drain electrode 134. However, the film stack structure of the TFT 100 is not limited to the illustrated one of FIG. 1. In another embodiment, as shown in FIG. 3, the organic gate dielectric layer 120 only covers gate electrode 110 such that portions of the source electrode 132, the drain electrode 134, and the MOS layer 140 are located on the organic gate dielectric layer 120.

Compared with known ones, TFTs 100, 200 including the MOS layer 140 as channel layer can have higher electron mobility. Thus, TFTs 100 and 200 can be applied in back plates of organic light emitting diode or other applications. Furthermore, because the TFT 100 can be fabricated at a low temperature, thus when the substrate 101 of the TFT 100 or 200 is a flexible substrate such as a plastic substrate, the substrate 101 doesn't deteriorate or transform during the fabricating process of the TFT 100 or 200. That is, the TFT 100 or 200 can be used in flexible display applications such as electronic paper or flexible display devices.

The TFT 100 or 200 described above is a bottom gate type. However, the present embodiment is not limited to the bottom gate type and other configuration of the gate structure is further described as follows.

Figure 4:
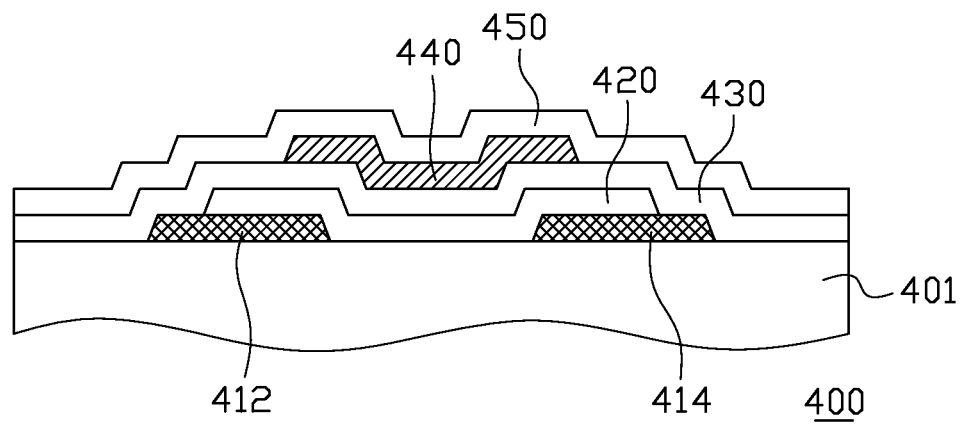
FIG. 4 is a schematic view of a thin film transistor in accordance with a fourth embodiment.

FIG. 4 is a schematic view of a TFT in accordance with another embodiment. Referring to FIG. 4, a TFT 400 is disposed on a substrate 401, and the TFT 400 includes a source electrode 412, a drain electrode 414, a MOS layer 420, an organic gate dielectric layer 430 and a gate electrode 440. The substrate 401 can be a rigid substrate such as a glass substrate or a flexible substrate such as a plastic substrate.

As described in above embodiments, when the substrate 401 is a flexible substrate, the substrate 401 can be disposed onto a rigid carrier plate (not shown) before performing a fabricating process of the TFT 400. After the TFT 400 is finished, the rigid carrier plate can be separated from the substrate 401.

Referring again to FIG. 4, the source electrode 412 and the drain electrode 414 are disposed on the substrate 401. The MOS layer 420 is disposed above the substrate 401 to cover the source electrode 412 and the drain electrode 414. The MOS layer 420 may include an indium gallium zinc oxide (IGZO), indium zinc oxide (IZO) or a combination thereof. The organic gate dielectric layer 430 is disposed on the MOS layer. The gate electrode 440 is disposed on the organic gate dielectric layer 430. Additionally, in the present embodiment, the TFT 400 further includes a protective layer 450 disposed on the organic gate dielectric layer 430 to cover the gate electrode 440. The TFT 400 is a top gate type.

The gate electrode 440, for example, includes molybdenum. The organic gate dielectric layer 430 and the protective layer 450, for example, consist of flexible organic materials such as organic polymers (i.e., resin or other polymers). The source electrode 412, and the drain electrode 414, for example, is a composite layer of titanium/aluminum/titanium.

Figure 5:
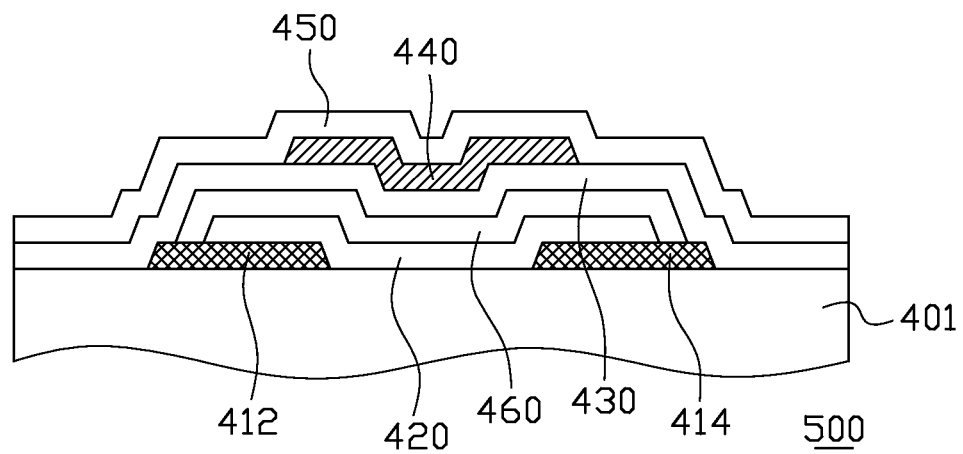
FIG. 5 is a schematic view of a thin film transistor in accordance with a fifth embodiment.

To avoid the negative influence of the organic gate dielectric layer 430 to the MOS layer 420, in another embodiment, as shown in FIG. 5, a TFT 500 further includes a barrier layer 460 disposed between the organic gate dielectric layer 430 and the MOS layer 420.

Similar to the reasons of the TFTs 100, 200, the TFTs 400, 500 also have improved electron mobility compared with those know TFTs.

In summary, the embodiment or the embodiments may have at least one of the following advantages. TFTs of the embodiments utilize a MOS layer as the channel layer. Thus, the electron mobility of the channel layer is improved. In addition, because the MOS layer doesn't require a high temperature fabricating process, and the organic gate dielectric layer can be a flexible organic material, therefore the TFT of the embodiments can be applied into flexible display devices, thereby improving the flexibility of TFT applications.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A thin film transistor, configured for being disposed on a substrate, comprising:
   a gate electrode, disposed on the substrate;
   an organic gate dielectric layer, disposed on the substrate to cover the gate electrode;
   a source electrode and a drain electrode, disposed above the organic gate dielectric layer;
   a metal oxide semiconductor layer, disposed on the organic gate dielectric layer and contacts with the source electrode and the drain electrode; and
   a barrier layer disposed between the metal oxide semiconductor layer and the organic gate dielectric layer, and disposed between the metal oxide semiconductor layer and the source electrode/drain electrode.

2. The thin film transistor of claim 1, wherein the metal oxide semiconductor layer comprises indium gallium zinc oxide, indium zinc oxide or a combination thereof.

3. The thin film transistor of claim 1, wherein the organic gate dielectric layer comprises a flexible organic material.

4. The thin film transistor of claim 1, wherein the organic gate dielectric layer comprises an organic polymer.

5. The thin film transistor of claim 1, wherein the barrier layer comprises silicon oxide.

6. A thin film transistor, configured for being disposed on a substrate, comprising:
   a source electrode and a drain electrode, disposed on the substrate;
   a metal oxide semiconductor layer, disposed above the substrate to cover the source electrode and the drain electrode;

an organic gate dielectric layer, disposed on the metal oxide semiconductor layer; and a gate electrode, disposed on the organic gate dielectric layer; and a barrier layer disposed between the metal oxide semiconductor layer and the organic gate dielectric layer.

7. The thin film transistor of claim 6, wherein the metal oxide semiconductor layer comprises indium gallium zinc oxide, indium zinc oxide or a combination thereof.

8. The thin film transistor of claim 6, wherein the organic gate dielectric layer comprises a flexible organic material.

9. The thin film transistor of claim 6, wherein the organic gate dielectric layer comprises an organic polymer.

10. The thin film transistor of claim 6, wherein the barrier layer comprises silicon oxide.

* * * * *